(12) United States Patent
Kuzmenka

(10) Patent No.: US 7,061,089 B2
(45) Date of Patent: Jun. 13, 2006

(54) MEMORY MODULE HAVING SPACE-SAVING ARRANGEMENT OF MEMORY CHIPS AND MEMORY CHIP THEREFORE

(75) Inventor: Maksim Kuzmenka, Munich (DE)

(73) Assignee: Infineon Technologies AG, Munich (DE)

( * ) Notice: Subject to any disclaimer, the term of this patent is extended or adjusted under 35 U.S.C. 154(b) by 49 days.

(21) Appl. No.: 10/828,034

(22) Filed: Apr. 20, 2004

(65) Prior Publication Data

US 2004/0212070 A1 Oct. 28, 2004

(30) Foreign Application Priority Data

Apr. 24, 2003 (EP) .................................. 03009324

(51) Int. Cl.
*H01L 23/48* (2006.01)

(52) U.S. Cl. ....................................... 257/686; 257/777

(58) Field of Classification Search ..................... None
See application file for complete search history.

(56) References Cited

U.S. PATENT DOCUMENTS

| | | | |
|---|---|---|---|
| 5,239,447 A | | 8/1993 | Cotues et al. |
| 5,513,135 A | * | 4/1996 | Dell et al. ..................... 365/52 |
| 5,801,448 A | * | 9/1998 | Ball .......................... 257/778 |
| 6,163,070 A | | 12/2000 | Mori |
| 6,169,325 B1 | * | 1/2001 | Azuma et al. ............... 257/685 |
| 6,418,033 B1 | * | 7/2002 | Rinne .......................... 361/784 |
| 6,480,014 B1 | | 11/2002 | Li et al. |
| 6,873,036 B1 | * | 3/2005 | Akram ........................ 257/686 |
| 2002/0130422 A1 | | 9/2002 | Venkateshwaran |
| 2003/0021096 A1 | | 1/2003 | Vinson et al. |
| 2004/0124520 A1 | * | 7/2004 | Rinne .......................... 257/686 |

FOREIGN PATENT DOCUMENTS

| | | |
|---|---|---|
| DE | 100 34 081 A1 | 10/2001 |
| EP | 0 531 724 A1 | 3/1993 |
| EP | 0 924 764 A2 | 6/1999 |
| JP | 03 148842 A | 6/1991 |

\* cited by examiner

*Primary Examiner*—Leonardo Andújar
(74) *Attorney, Agent, or Firm*—Slater & Matsil, L.L.P.

(57) ABSTRACT

A memory module has a module board having a main surface. A plurality of memory chips is arranged on the main surface of the module board. Each memory chip has two main surfaces extending between a first end face and a second end face of the memory chip, first mounting sites mounted to the main surface of the module board, and second mounting sites spaced apart from the first mounting sites and mounted to support sites spaced apart from the module board, so that a distance between the first end face and the module board is greater than a distance between the second end face and the module board. A circuit chip suited for such a memory module has terminals for connecting a circuitry of the circuit chip to terminals on the motherboard. Moreover, conductive structures are provided on a surface of the circuit chip for connecting terminals of another circuit chip to terminals on the motherboard.

18 Claims, 7 Drawing Sheets

FIG 1A TOP VIEW

FIG 1B SIDE VIEW

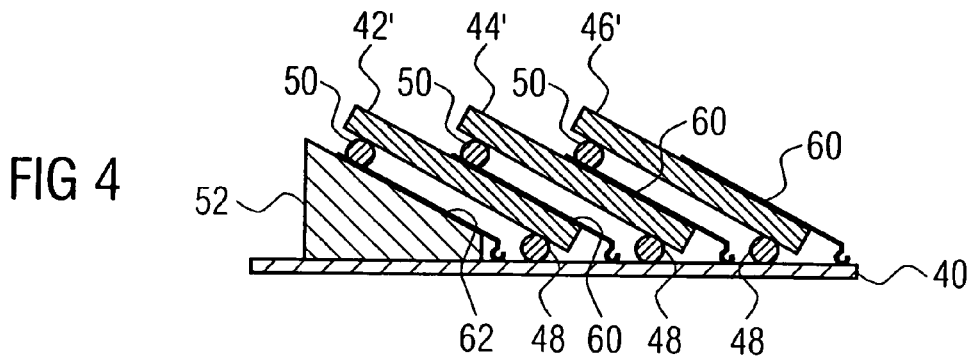
FIG 4
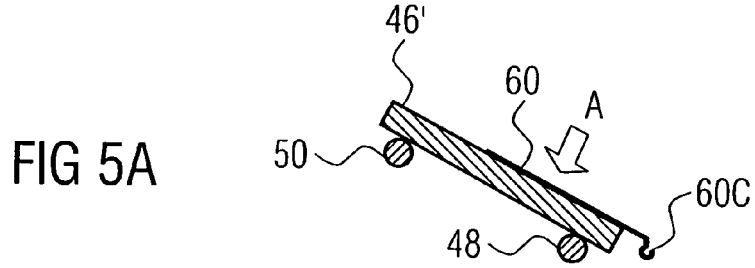
FIG 5A
FIG 5B
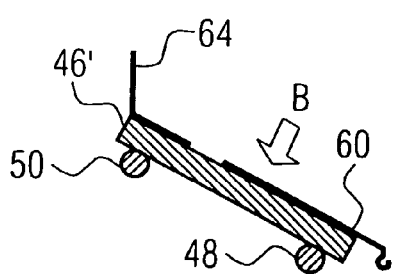
FIG 6A
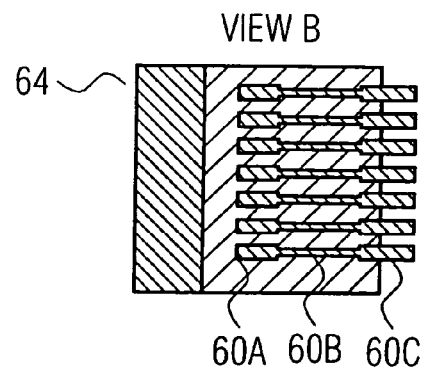
FIG 6B

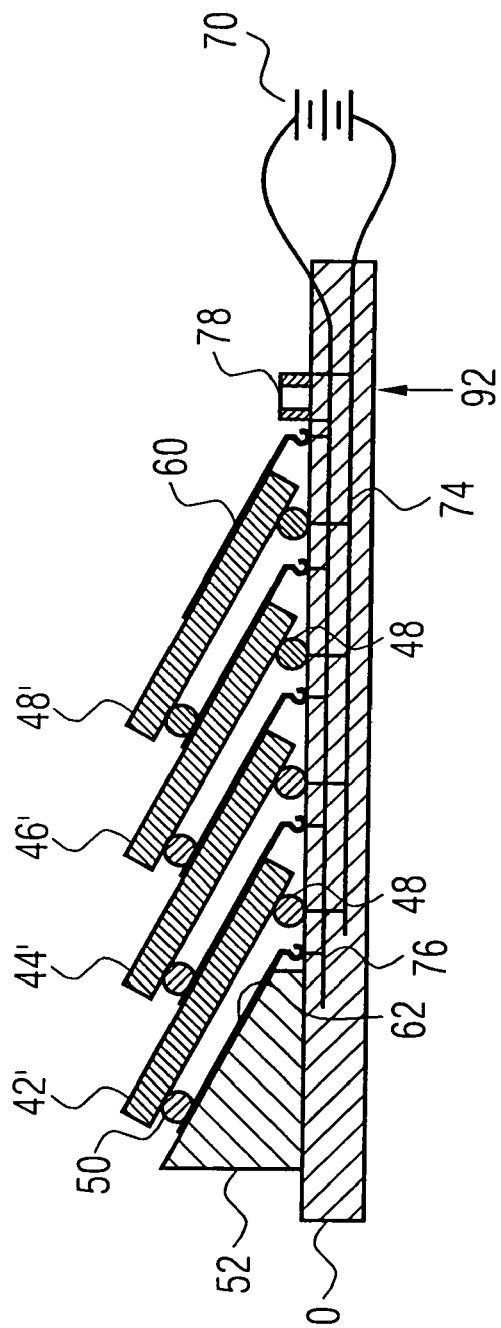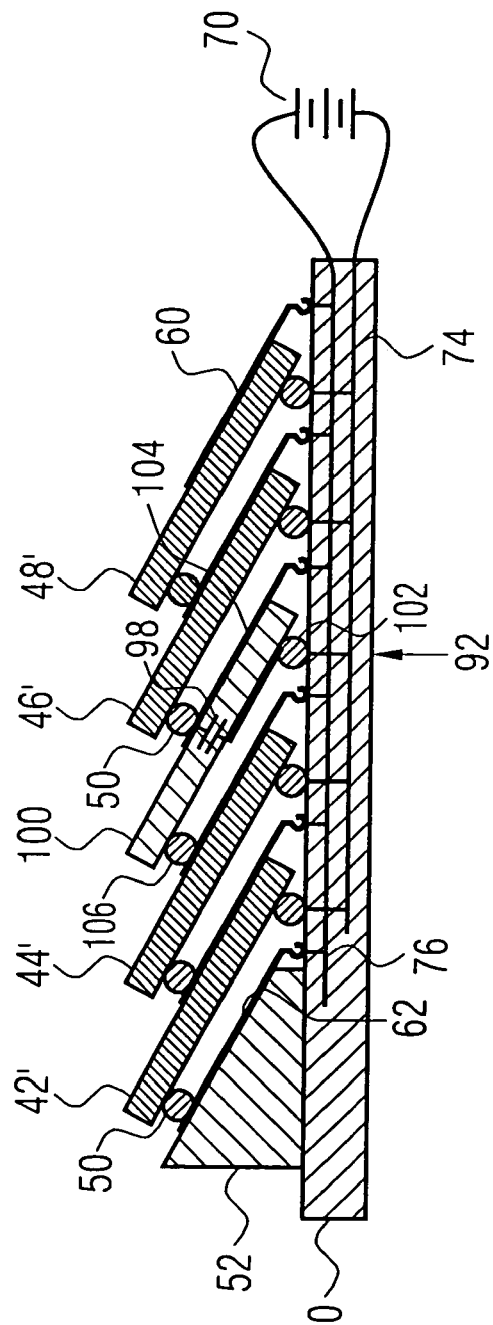

MEMORY MODULE HAVING SPACE-SAVING ARRANGEMENT OF MEMORY CHIPS AND MEMORY CHIP THEREFORE

BACKGROUND OF THE INVENTION

1. Field of the Invention

The present invention relates to a memory module and, in particular, to a memory module on which memory chips are arranged in a space-saving manner. In addition, the present invention relates to a memory chip suited for such a memory module.

2. Description of the Prior Art

A top view and a side view of a prior art memory module are shown in FIGS. 11a and 11b.

The memory module comprises a memory module board 10, memory chips 12 located on a first main surface of the memory module board 10 and memory chips 14 arranged on a second main surface of the memory module board which is opposite to the first main surface. Circuitry for controlling the operation of the memory chips 12 and 14, such as a PLL 16 (PLL=phase locked loop) and command address registers 18 are provided on the memory module board 10. Comparable circuitry can be formed on the back side of the memory module board not shown in FIG. 11a. The memory controller is usually arranged on a motherboard having a plug-in connector into which the memory module shown in FIGS. 11a and 11b is plugged such that terminals 20 of an edge connector of the memory module board 10 are connected to mating terminals in the plug-in connector. In addition, a memory controller can be provided on the motherboard. For the sake of clarity, respective conductive traces connecting the elements of the memory module to each other are not shown in FIGS. 11a and 11b.

As can be seen in FIG. 11a, four memory chips, DRAMs in the memory module shown, are arranged on both, the top side and the back side of the module board on the left of the circuitry 16, 18, and five memory chips are arranged on both, the top side and the back side of the memory module board 10, on the right of the circuitry 16, 18. Thus, in total, eight memory chips are located on the left of the circuitry 16, 18 and ten memory chips are located on the right thereof. Thus, only a limited number of eighteen DRAMs can be placed on a memory module of a given size using existing stacking technology.

In order to reduce the space requirements of memories, one prior art approach is to stack DRAM chips on a module board onto each other. A further prior art approach is to stack respective module boards onto each other or to provide a foldable electronic memory module assembly as available from Kentron[R] Technologies under the product name FEMMA™.

U.S. Pat. No. B1-6,480,014 relates to high density, high frequency memory chip modules wherein a respective memory chip is mounted to a daughter board. The daughter board is provided with a plurality of pins along one edge thereof. The pins are inserted into matching holes provided in a module board and soldered thereto. When mounted to the module board, the daughter boards and the memory chips mounted thereto are oriented vertical or inclined with respect to the module board. Moreover, heat spreaders can be provided on the respective daughter boards.

SUMMARY OF THE INVENTION

It is the object of the present invention to provide a memory module and a memory chip, which permit to arrange an increased number of memory chips per memory module area in a stable manner.

In accordance with a first aspect, the present invention provides a memory module having a module board having a main surface; a plurality of memory chips arranged on the main surface of the module board, each memory chip having two main surfaces extending between a first end face and a second end face of the memory chip; first mounting sites mounted to the main surface of the module board; second mounting sites spaced apart from the first mounting sites and mounted to support sites spaced apart from the module board, so that a distance between the first end face and the module board is greater than a distance between the second end face and the module board.

In accordance with a second aspect, the invention provides a circuit chip having terminals for connecting a circuitry of the circuit chip to terminals on a motherboard; and conductive structures on an external surface of the circuit chip for connecting terminals of another circuit chip to terminals on the motherboard.

The present invention is based on the recognition that memory chips, DRAMs for example, can be placed in an easy, space-saving and stable manner on a module board when the memory chips comprise first and second mounting sites spaced apart from each other and mounted to respective support sites so that the memory chips are arranged inclined with respect to the surface of the module board. In other words, in the inventive memory module, the memory chips are arranged with a sharp angle between the main surface thereof and the main surface of the module board on which the chips are arranged, wherein, in principle, this angle can be up to 90 degrees. Such an arrangement can be designated as a ladder packaging of chips on the memory module, since the memory chips are arranged comparable to a ladder having inclined ladder steps.

According to preferred embodiments of the invention, a support structure for the first one of a row of memory chips arranged in this manner is provided, which supports this first memory chip in an inclined manner with respect to the module board.

The second mounting sites of the memory chips mounted to support sites spaced apart from the module board permit a stable arrangement of the memory chips in the inventive memory module and, in addition, permit the memory chips to be arranged with a high density. Thus, according to the present invention, a memory module can have an increased number of memory chips per memory module of a given size. In addition, according to the present invention, it is possible to reduce the dimensions of a module having a given number of chips, and as a consequence, to reduce the electrical length of internal connections, the command-address bus, for example. Thus, it is possible to overcome some topological limitation of existing systems, since, according to the invention, a shorter delay of the clock and command address signals reduce overall system latency.

In preferred embodiments of the present invention, the first mounting sites are formed by a first row of terminals, while the second mounting sites are formed by a second row of terminals. The first row of terminals is directly connected to associated terminals on the module board, while the second row of terminals is connected to associated terminals on the module board via conductive structures on a respective support, on which the support sites to which the second mounting sites are mounted are provided. The respective support may be an adjacent memory chip, the support structure provided for the first one of a row of memory chips, or a capacitor chip, which is arranged between two memory chips in a similar manner as the memory chips are arranged.

The memory chips and/or the capacitor chip used in the inventive memory module can have such a structure. In preferred embodiments, the terminals of a circuit chip associated to the circuit chip itself are provided on one main surface thereof, whereas the conductive structures are provided on a second main surface thereof opposite to the first main surface.

In order to deal with a higher amount of heat generated by the larger number of memory chips, DRAMs, for example, heat-sinks can be provided between the respective memory chips. The heat-sinks can be formed as part of the respective memory chips.

BRIEF DESCRIPTION OF THE DRAWINGS

These and other objects and features of the present invention will become clear from the following description taken in conjunction with the accompanying drawings, in which:

FIG. 4 is a schematic side view of ladder-like placed memory chips with additional lead-frames;

FIGS. 5a and 5b are schematic views of a memory chip used in the arrangement shown in FIG. 4;

FIGS. 6a and 6b are schematic views of an alternative of the memory chips shown in FIGS. 5a and 5b;

FIGS. 7 and 8 are modifications of the embodiment of an inventive memory module shown in FIG. 4;

DESCRIPTION OF THE PREFERRED EMBODIMENTS

Figure 1:
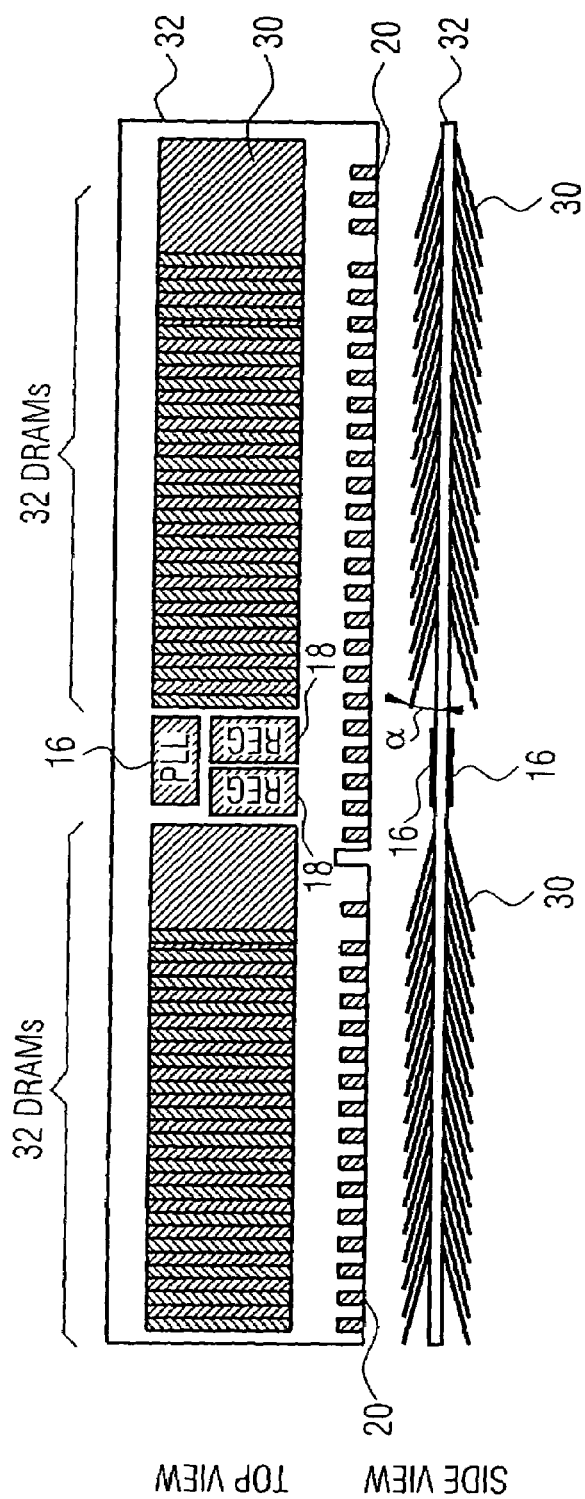
FIGS. 1a and 1b is a top view and a side view of an embodiment of an inventive memory module.

An embodiment of the present invention having arranged thirty-four DRAMs 30 on each main surface of a memory module board 32 is shown in FIGS. 1a and 1b. As can be seen from the side view in FIG. 1b, each of the DRAMs 30 is located inclined with respect to the memory module board 32 such that a sharp angle □ is formed between a main surface of the respective DRAM and the main surface of the memory module board 32 on which the DRAM is arranged.

As in the prior art memory module, circuitry, such as a PLL 16 and command address registers 18, for controlling operation of the memory chips 30 are provided on both main surfaces of the memory module board 32. As in the prior art memory module, the memory module board 32 comprises an edge connector having terminals 20 to be connected to mating terminals in a plug-in connector on a motherboard.

Again, for the sake of clarity, conductive traces for connecting the terminals 20, the circuitry 16, 18 and the memory chips 30 are omitted in FIGS. 1a and 1b since same are not critical to the invention.

As it is indicated in FIGS. 1a and 1b, the inventive arrangement of the memory chips permits placing of thirty-two DRAMs on the left of the circuitry 16,18 and of thirty-six DRAMs on the right of the circuitry 16, 18, while making use of a memory module board 32 having the same size as the 30 prior art memory module board and making use of memory chips having the same size as in the prior art memory module. Thus, the present invention allows for a stable and easy arrangement of a remarkably higher number of memory chips on a memory module as in the prior art with only a moderately increased space requirement in the direction normal to the main surfaces of the memory module board.

Embodiments as to how the inventive arrangement of the memory chips can be realized are described hereinafter making reference to FIGS. 2 to 6.

Figure 2:
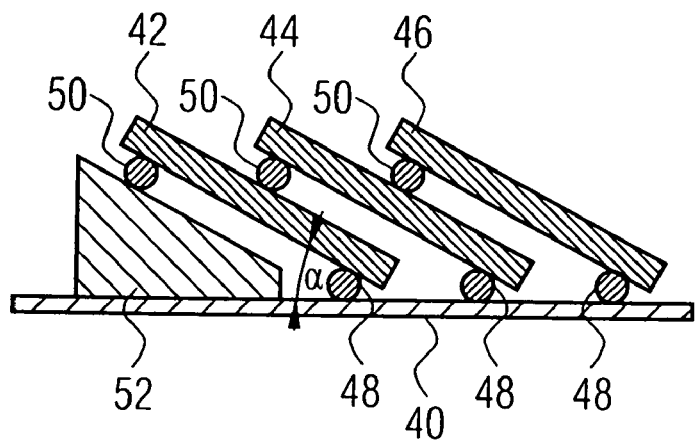
FIGS. 2 and 3 are schematic side views of ladder-like placed memory chips.

In FIG. 2, a memory module board 40 and three memory chips 42, 44 and 46 arranged thereon are shown. The memory chips 42, 44 and 46 comprise a BGA package (BGA=ball grid array) having a first row of solder balls 48 and a second row of solder balls 50 as respective terminals thereof.

According to FIG. 2, the solder balls 48 of the first row of terminals are soldered to corresponding contact plates (pads) (not shown) on the memory module board 40. The solder balls 50 of the second rows of terminals are soldered to connection plates, metal plates for example, on the back of the respective adjacent chip to the left. Moreover, a support structure in the form of a support wedge 52 is provided on the memory module board 40 to support the memory chip 42 with a sharp angle □ between this memory chip and the memory module board 40. The support wedge 52 can be of any suitable form and material to hold the memory chips in the arrangement shown. For example, the support which can be made of any dielectric material, plastic or ceramic, for example. The memory chip 44 is supported by the memory chip 42 adjacent to the left and the memory chip 46 is supported by the memory chip 44 adjacent to the left.

As can be derived from FIGS. 1 and 2, the ladder packaging and placement of the memory chips on the module board according to the invention allows to increase the number of chips per module in comparison with existing non-stacked and stacked technology. By the larger number of memory chips, DRAMs for example, a higher amount of heat is generated. In order to deal with such higher amount of generated heat, it may be necessary to provide heat-sinks for the memory chips as it is shown in FIG. 3.

Figure 3:
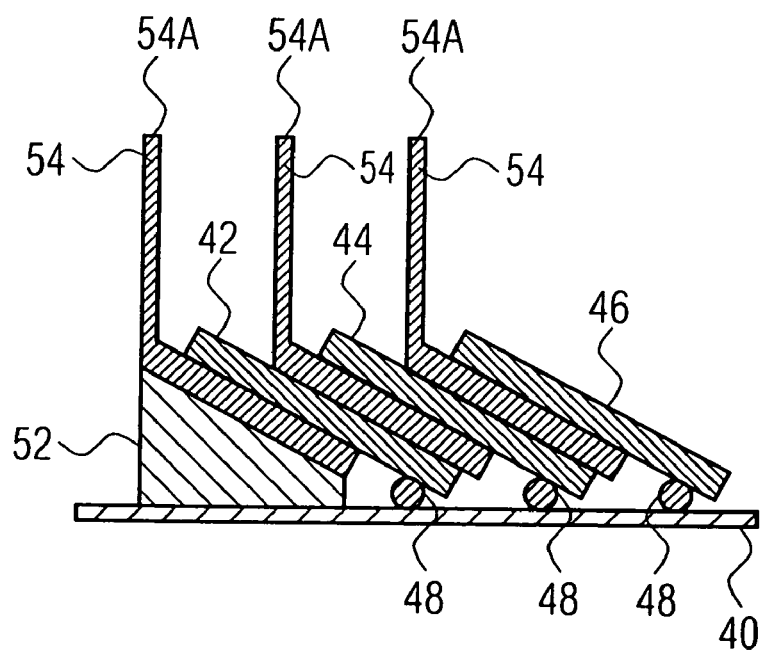

According to FIG. 3, the memory chips 42, 44 and 46 have a single row of solder balls 48 only. Contrary to the embodiment shown in FIG. 2, the chips are not connected via respective solder balls to an adjacent chip or the support wedge 52, but respective heat-sinks 54 are provided between the memory chip 42 and the support wedge 52 and between the memory chips 42 and 44 as well as between the memory chips 44 and 46. The heat-sinks 54 can be of any suitable form to permit spreading of heat produced by the memory chips from the memory chips. Moreover, the distant heat-sink ends could be connected to an external heat spreader if necessary. The connection of the memory chips making using of the heat-sinks 54 can be implemented by any suitable technique, making use of solder or glue, for example.

According to FIGS. 2 and 3, only one row of solder balls of the respective BGA package can be used for electrical connection to the module board 40. To solve this problem, additional contacts on the back of the respective memory chips and an additional set of pins which can be soldered to the memory module board can be provided. Such an arrangement is shown in FIG. 4. According to FIG. 4, each of the memory chips 42', 44' and 46' has provided on the back side thereof a conductive structure 60. Moreover, a comparable conductive structure 62 is provided on the inclined surface of the support wedge 52. Via the conductive structures 60 and 62, the solder balls 50 of the respective second row of terminals can be connected to pads (not shown) on the memory module board 40.

As can be seen from FIGS. 5a and 5b showing a side view of the memory chip 46' and a top view (view A) thereof, each conductive structure 60 has a plurality of conductive substructures isolated from each other. Each conductive substructure has a contact plate 60a for soldering of solder balls 50 of the next chip to the right, a conductive trace 60b (lead-frame or PCB style trace) and a pin 60c for soldering to the corresponding pad on the memory module board 40. The conductive structure 62 provided on the support wedge 52 has a comparable structure.

With the approach shown in FIGS. 4, 5a and 5b, all solder balls of a BGA package can be used for electrical connections with the memory module board. One half of the terminals of the memory chips, i.e. the solder balls 48 of the respective first row, will have a very short connection, while the other half of the terminals, i.e. the solder balls 50 of the respective second row, will have a longer connection via the conductive structures 60 and 62. The terminals 48 having the short connection with the low parasitic inductance L and capacitance C will preferably be used for data I/O high-speed signals (I/O=input/output). The other half of the terminals can be used for control signals which are not so critical with respect to parasitic inductance and capacitance, for the command address bus, for example.

For providing a heat-sink between the respective memory chips in the embodiment shown in FIG. 4, each of the memory chips can be provided with a heat-sink of a suitable material, metal for example.

An embodiment of such a chip is shown in FIGS. 6a and 6b. As can be seen, on the back of the memory chip 46', a heat-sink 64 is provided in addition to the conductive structure 60. FIG. 6a shows a side view of the memory chip, while FIG. 6b shows a top view (view B) thereof. When placing the chips 46' having the heat-sink 64 on the back thereof in the inventive ladder-like arrangement, the heat-sinks 64 will be effective to spread heat from the memory chips and therefore to avoid malfunctions due to overheating thereof.

The term that the memory chip is arranged in an inclined manner relative to the module board used herein is intended to encompass all orientations of the module board and the memory chips relative to each other in which the distance between one end of a memory chip and the module board is larger than the distance between the other end of the memory chip and the module board. In other words, the term is intended to encompass all such orientations which allow the memory chips to overlap each other (in a direction normal to the surface of the module board) and which allow one end of each memory chip to be connected to the printed circuit board while the other end thereof is connected to a respective adjacent neighbor structure spaced from the printed circuit board. With all such orientations, a space-saving arrangement according to the invention can be obtained. The effect of space-saving according to the invention can be doubled when a ladder-like arrangement according to the invention is provided on both main surfaces of a memory module board.

An advantageous approach with respect to power supply connections for the inventive ladder arrangement of memory chips will be described hereinafter making reference to FIGS. 7 to 10.

FIG. 7 shows an arrangement comparable to the arrangement shown in FIG. 4 and including four memory chips 42', 44', 46', and 48'. In addition, a power supply 70 is schematically shown in FIG. 7. A respective terminal of the first row of terminals 48 of each of the memory chips is connected to a first power supply plane (power supply trace) 74, while a respective one of the second row of terminals 50 of each memory chip is connected to a second power supply plane 76. In addition, a capacitor 78 is connected between the first power supply plane 74 and the second power supply plane 76. The capacitor 78 is charged by the power supply 70 and represents a low impedance local power supply for charging driver capacitances of respective drivers inside the memory chips.

In the embodiment shown in FIG. 7, the capacitor 78 is mounted to the main surface of the memory module board 40 onto which the memory chips are mounted. The capacitor 78 may be a SMD package (SMD=surface mount device), for example.

Figure 9:
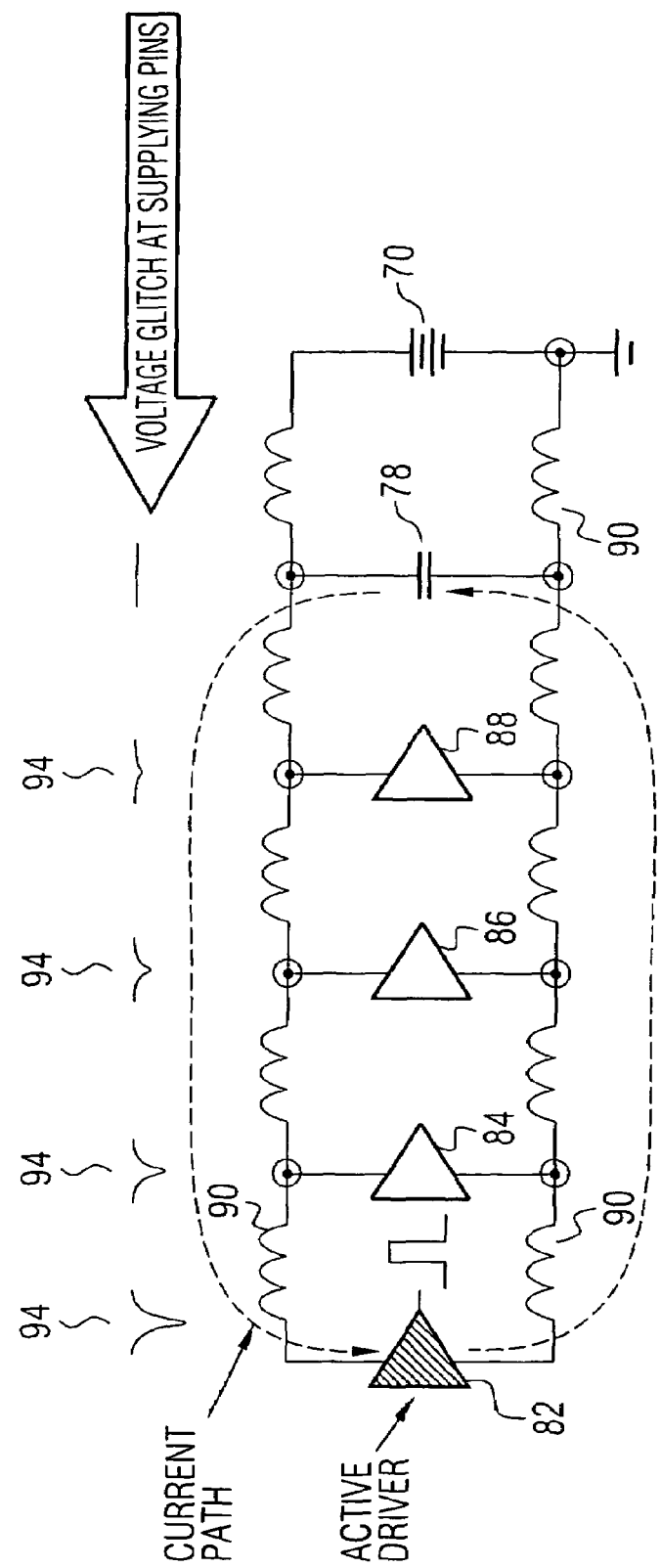
FIG. 9 is a simplified circuit diagram showing the power supply of the memory module shown in FIG. 7.

FIG. 9 shows a schematic circuit diagram including those components of the memory module pertinent with respect to supplying power to the drivers of the memory chips. In FIG. 9, respective drivers 82, 84, 86, and 88 associated to the memory chips 42', 44', 46', and 48', respectively, are shown. Moreover, respective inductances 90 caused by the first and second power supply traces 74 and 76 are shown.

In FIG. 9, the driver 82 associated with the memory chip 42' represents an active driver. As can be seen from FIG. 9, the current path (indicated by dashed arrows) for the left most chip 42' (and therefore, the active driver 82) is elongated and includes eight inductances 90 between the terminals of the capacitor 78 and the terminals of the active driver 82. As it is indicated in FIG. 7, a low impedance point 92 is formed at the capacitor 78. Due to the high inductance between the terminals of the capacitor 78 and the terminals of the active driver 82, the power supply for the active driver 82 is affected by the voltage drop across the inductances 90 of the power supply traces. This is illustrated by the voltage glitches 94 indicated in FIG. 9.

Since the parasitic inductance presented by the power supply traces increases with an increased distance of a respective driver from the capacitor 78, the negative effect of the voltage drops via the inductances increases with an increased distance from the capacitor 78. Thus, the negative effect could be reduced by reducing the average distance of the drivers from the capacitors and, thereby, reducing the average line lengths.

One approach to deal with the above problem would be to provide a capacitor on the backside of one of the center chips 44' and 46' to thus reduce the line length between the terminals of the capacitor and the terminals of the drivers of the memory chips. To this end, one or more capacitors could be soldered on the backside of one of the chips not covered by the adjacent chip. For example, the capacitor could be mounted instead of the heat-sink 64 shown in FIG. 6a at the same position as the heat-sink. Such a capacitor could be formed as a SMD package, for example.

Figure 10:
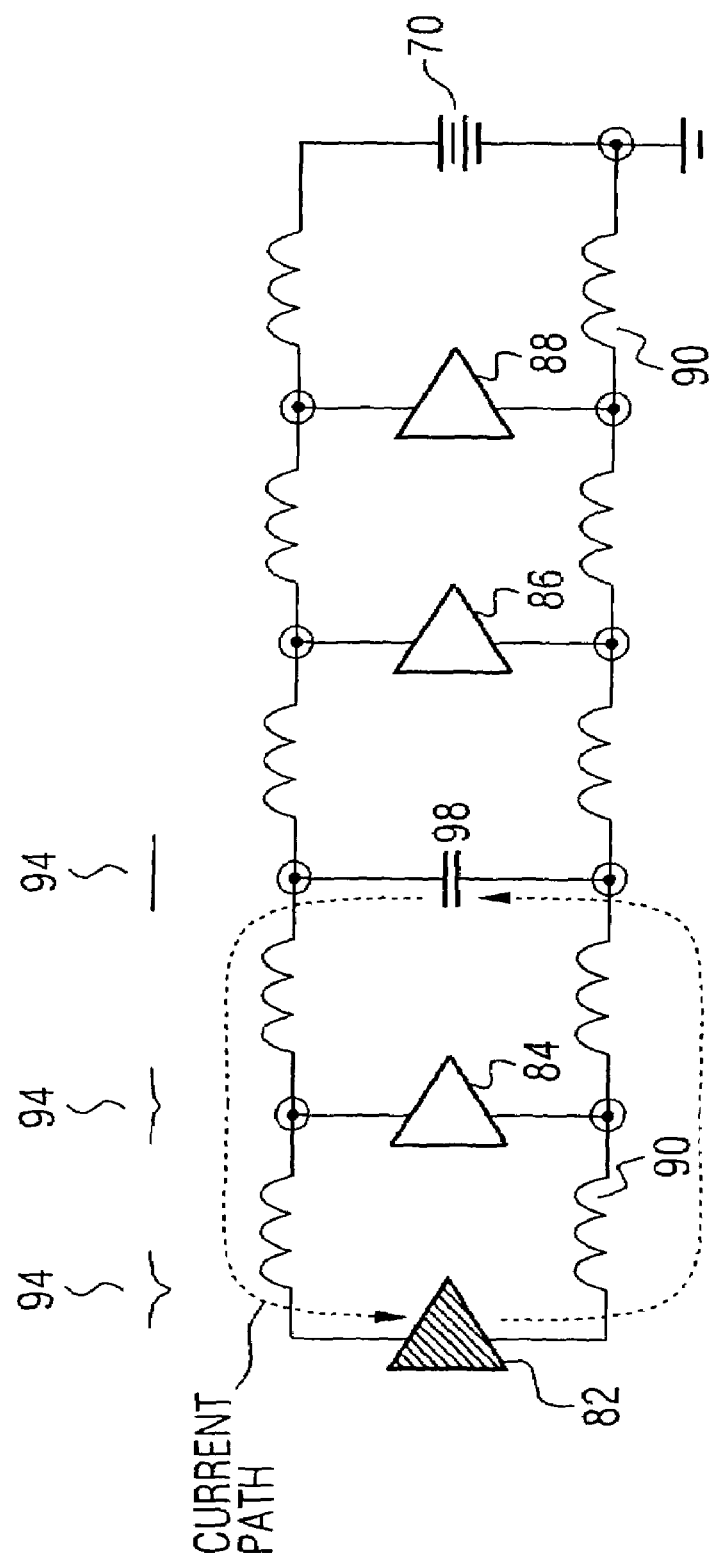
FIG. 10 is a simplified circuit diagram showing the power supply of the memory module shown in FIG. 8.
Figure 11:
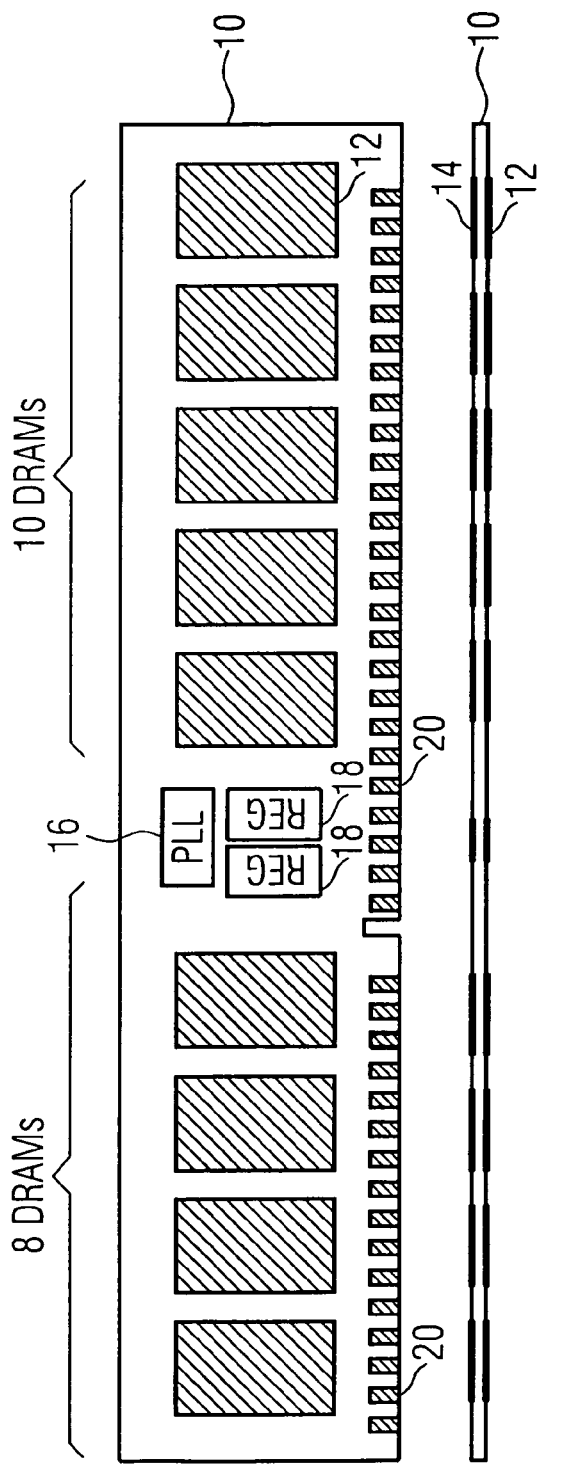
FIGS. 11a and 11b are a top view and a side view of a prior art memory module.

An alternative approach is shown in FIG. 8, in which a capacitor 98 is implemented in a capacitor chip 100 having the same kind of package as the memory chips 42', 44', 46', and 48'. The capacitor chip 100 is provided between the center memory chips 44' and 46' so that a current path between the terminals of the capacitor and the terminals of a respective driver as long as the current path for the active driver 82 shown in FIG. 9 can be avoided. This can be derived from FIG. 10 showing a schematic circuit diagram illustrating those components pertinent with respect to the power supply for the drivers 82, 84, 86, and 88. As can be seen from FIG. 10, the length of the current path (indicated by dashed arrows) for the active driver 82 is substantially reduced when compared to FIG. 9.

The respective connection of the terminals of the capacitor 98 to the power supply planes 74 and 76 is achieved via at least one of a first row of capacitor chip terminals 102 and via a conductive structure 104 provided on the backside of the capacitor chip 100. To be more specific, the terminal 102 is connected to the power supply plane 74 and one terminal of the capacitor 98 is connected to a conductive trace of the conductive structure 104, which also connects the power supply pin of the second row of terminals 50 of the memory chip 46' to the power supply plane 76. The conductive structure 104 is preferably identical to the conductive structures 60 provided on the backsides of the memory chips 42', 44',46', and 48', so that the second row of terminals 50 of the memory chip 46' is connected to respective terminals on the memory board 40 via the conductive structure 104. A second row of capacitor chip terminals 106 is for support of the capacitor chip only and does not have an electrical function.

One capacitor chip as shown in FIG. 8 can be provided for a respective number of memory chips in order to obtain reduced power supply current paths for all memory chips on the module board. Although the capacitor chip 100 shown in FIG. 8 has a thickness identical to the thickness of the memory chips, the actual thickness of such a capacitor chip can be different (and, in particular, lower) than the thickness of the memory chips.

With the arrangement shown in FIG. 8, the effect of the voltage drops across the parasitic inductances caused by the power supply traces can be substantially reduced as can be seen from the voltage glitches at the supplying pins indicated in FIG. 10.

While this invention has been described in terms of several preferred embodiments, there are alterations, permutations, and equivalents which fall within the scope of this invention. It should also be noted that there are many alternative ways of implementing the methods and compositions of the present invention. It is therefore intended that the following appended claims be interpreted as including all such alterations, permutations, and equivalents as fall within the true spirit and scope of the present invention.

What is claimed is:

1. A module comprising:
a module board having a main surface;
a plurality of semiconductor chips arranged on the main surface of the module board, each semiconductor chip comprising:
two main surfaces extending between a first end face and a second end face of the semiconductor chip;
first mounting sites mounted to the main surface of the module board;
second mounting sites spaced apart from the first mounting sites and mounted to support sites spaced apart from the module board,
so that a distance between the first end face and the module board is greater than a distance between the second end face and the module board,
wherein the second mounting sites of at least one of the semiconductor chips are mounted to conductive structures on a surface of an adjacent chip, said conductive structures extending along the surface so as to electrically connect said second mounting sites directly to terminals on the module board.

2. The module according to claim 1, further comprising a support structure to which the second mounting sites of at least one of the memory semiconductor chips are mounted.

3. The module according to claim 1, wherein the first mounting sites are formed by a first row of terminals of the semiconductor chips, which are connected to associated terminals on the module board.

4. The module according to claim 3, wherein the second mounting sites of at least one semiconductor chip are formed by a second row of terminals, which are connected to a conductive structure on a support wherein the conductive structure is implemented to connect the second row of terminals directly to associated terminals on the module board.

5. The module according to claim 4, wherein the support is one of a main surface of an adjacent semiconductor chip, a surface of a dedicated support structure, a main surface of a capacitor chip, or a heat-sink provided on an adjacent semiconductor chip.

6. The module according to claim 1, wherein a capacitor is formed on a main surface of at least one of the semiconductor chips.

7. The module according to claim 1, further comprising a capacitor chip comprising:
two main surfaces extending between a first end face and a second end face of the capacitor chip;
first mounting sites mounted to the main surface of the module board;
second mounting sites spaced apart on the first mounting sites and mounted to support sites spaced apart from the module board, so that a distance between the first end face and the module board is greater than a distance between the second end face and the module board;
a first capacitor terminal, a second capacitor terminal and a capacitor connected between the first and the second capacitor terminals,
wherein the first capacitor terminal is connected to a first power supply plane on the module board and the second capacitor terminal is connected to a second power supply plane on the module board.

8. The module according to claim 1, wherein the module board has two main surfaces and wherein a respective plurality of semiconductor chips is arranged on both main surfaces of the module board.

9. The module according to claim 1, wherein the semiconductor chips comprise memory chips.

10. The module according to claim 9, further comprising a support structure to which the second mounting sites of at least one of the memory chips are mounted.

11. The module according to claim 9, wherein the first mounting sites are formed by a first row of terminals of the memory chips, which are connected to associated terminals on the module board.

12. The module according to claim 11, wherein the second mounting sites of at least one memory chip are formed by a second row of terminals, which are connected to a conductive structure on a support wherein the conductive structure is implemented to connect the second row of terminals directly to associated terminals on the module board.

13. The module according to claim 12, wherein the support is one of a main surface of an adjacent memory chip, a surface of a dedicated support structure, a main surface of a capacitor chip, or a heat-sink provided on an adjacent memory chip.

14. The module according to claim 9, wherein a capacitor is formed on a main surface of at least one of the memory chips.

15. The module according to claim 9, further comprising a capacitor chip comprising:
- two main surfaces extending between a first end face and a second end face of the capacitor chip;
- first mounting sites mounted to the main surface of the module board;
- second mounting sites spaced apart on the first mounting sites and mounted to support sites spaced apart from the module board, so that a distance between the first end face and the module board is greater than a distance between the second end face and the module board;
- a first capacitor terminal, a second capacitor terminal and a capacitor connected between the first and the second capacitor terminals,
- wherein the first capacitor terminal is connected to a first power supply plane on the module board and the second capacitor terminal is connected to a second power supply plane on the module board.

16. The module according to claim 9, wherein the module board has two main surfaces and wherein a respective plurality of memory chips is arranged on both main surfaces of the module board.

17. Memory module comprising:
- a module board having a main surface;
- a plurality of memory chips arranged on the main surface of the module board, each memory chip comprising:
- two main surfaces extending between a first end face and a second end face of the memory chip;
- first mounting sites mounted to the main surface of the module board;
- second mounting sites spaced apart from the first mounting sites and mounted to support sites spaced apart from the module board,
- so that a distance between the first end face and the module board is greater than a distance between the second end face and the module board,
- wherein the second mounting sites of at least one memory chip are formed by a second row of terminals, which are connected to a conductive structure on a support wherein the conductive structure is implemented to connect the second row of terminals to associated terminals on the module board, and
- wherein the support is a heat-sink provided on an adjacent memory chip.

18. Memory module comprising:
- a module board having a main surface;
- a plurality of memory chips arranged on the main surface of the module board, each memory chip comprising:
- two main surfaces extending between a first end face and a second end face of the memory chip;
- first mounting sites mounted to the main surface of the module board;
- second mounting sites spaced apart from the first mounting sites and mounted to support sites spaced apart from the module board,
- so that a distance between the first end face and the module board is greater than a distance between the second end face and the module board,
- wherein said memory module further comprises a capacitor chip comprising:
- two main surfaces extending between a first end face and a second end face of the capacitor chip;
- first mounting sites mounted to the main surface of the module board;
- second mounting sites spaced apart on the first mounting sites and mounted to support sites spaced apart from the module board, so that a distance between the first end face and the module board is greater than a distance between the second end face and the module board;
- a first capacitor terminal, a second capacitor terminal and a capacitor connected between the first and the second capacitor terminals,
- wherein the first capacitor terminal is connected to a first power supply plane on the module board and the second capacitor terminal is connected to a second power supply plane on the module board.

* * * * *